(12) United States Patent
Eakins et al.

(10) Patent No.: US 7,728,835 B2
(45) Date of Patent: Jun. 1, 2010

(54) METHOD AND APPARATUS FOR TRANSFERRING AN ANGLE-ANGLE VISION GRAPH TO A THREE DIMENSIONAL SURFACE

(75) Inventors: Mark E. Eakins, Kirkland, WA (US); Steven B. Rogers, Seattle, WA (US)

(73) Assignee: The Boeing Company, Chicago, IL (US)

( * ) Notice: Subject to any disclaimer, the term of this patent is extended or adjusted under 35 U.S.C. 154(b) by 843 days.

(21) Appl. No.: 11/549,631

(22) Filed: Oct. 13, 2006

(65) Prior Publication Data
US 2008/0088625 A1 Apr. 17, 2008

(51) Int. Cl.
*G06T 15/00* (2006.01)
(52) U.S. Cl. .................... 345/427; 428/172; 428/215; 359/630

(58) Field of Classification Search ............. 345/427; 428/172, 215; 359/630
See application file for complete search history.

(56) References Cited

U.S. PATENT DOCUMENTS 6,636,370 B2 * 10/2003 Freeman ............... 359/894
6,881,472 B2 * 4/2005 Freeman ............... 428/172

* cited by examiner

*Primary Examiner*—Phu Nguyen
(74) *Attorney, Agent, or Firm*—Brosemer, Kolefas & Associates

(57) ABSTRACT

A computer aided design system accurately determines the location, shape, and dimensions of a transparency that provides a field of view meeting a clear view area specified by a two dimensional polar vision plot. The computer aided design system projects points on the two dimensional polar vision plot onto a three dimensional surface of the transparency taking into account the observer's head position and the refraction of light caused by the transparency.

10 Claims, 6 Drawing Sheets

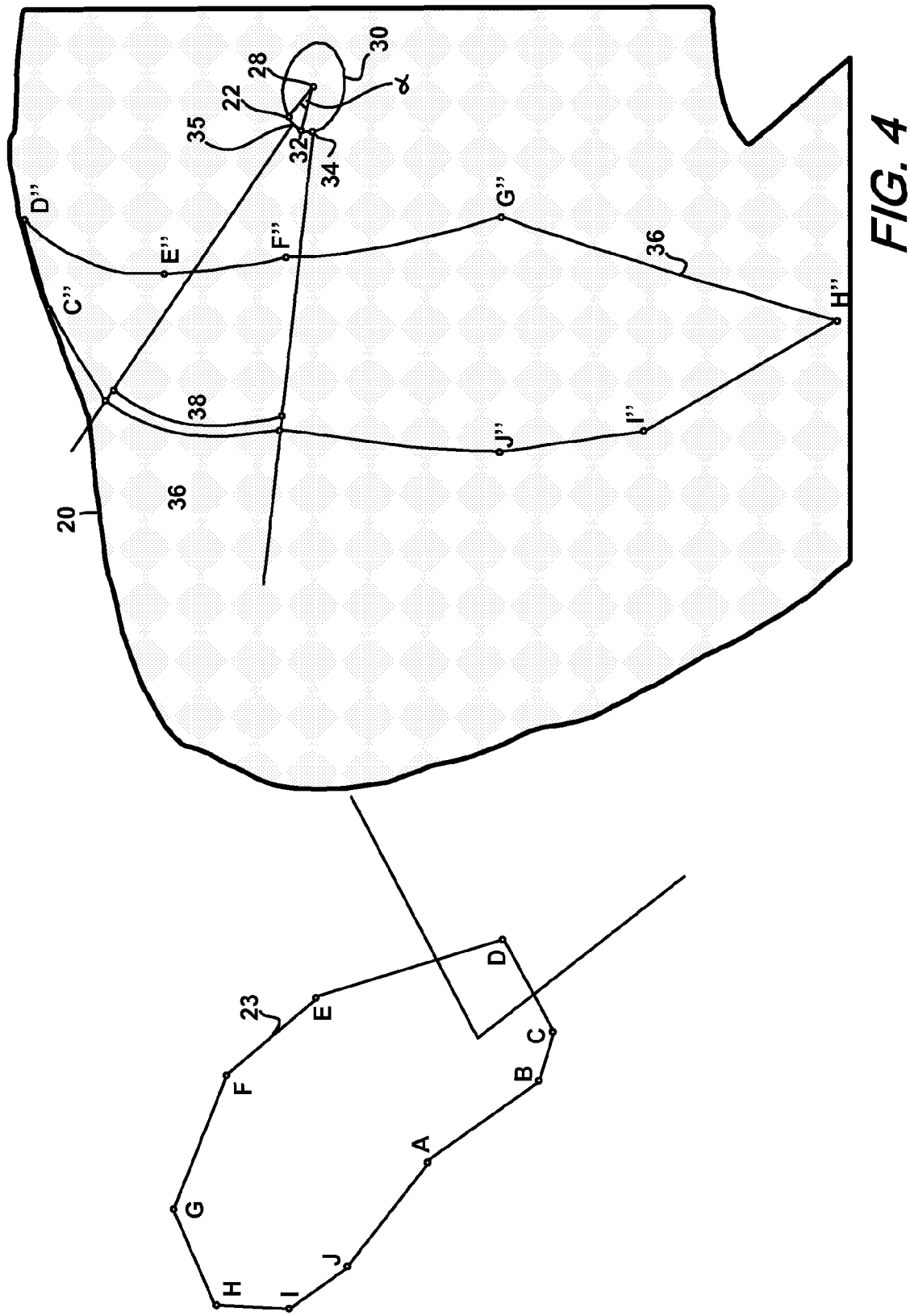

METHOD AND APPARATUS FOR TRANSFERRING AN ANGLE-ANGLE VISION GRAPH TO A THREE DIMENSIONAL SURFACE

CROSS REFERENCE TO RELATED APPLICATION

This application is related to United States patent application of Steven B. Rogers and Mark E. Eakins, entitled "Method and Apparatus for Obtaining a Polar Projection for a Flight Deck Window or the Like," filed in the United States Patent and Trademark Office on even date herewith.

TECHNICAL FIELD

This disclosure relates to computer aided design. More particularly, this disclosure relates to computer aided design of transparent structures, such as aircraft windshields.

BACKGROUND

This invention facilitates the task of designing the flight deck windows for a new aircraft/cab design. The external field of view created by an airliner's flight deck windows must satisfy many regulatory and design requirements. The total amount of transparent material is generally limited because the window material is very heavy. In addition, the size of individual windows is limited due to the expense and technical challenges of manufacturing large glass panels of suitable optical quality and the increase in aircraft weight and complexity associated with transferring loads around large window cutouts.

The external visual field can be evaluated using "polar projections," which are angle-angle plots of the limits of the solid angle that the pilots can see out of the windows. The "polar projections" are plots of the limits of the clear view area expressed in terms of coordinates representing angles left/right (azimuth) and angles up/down (altitude), measured from a line straight forward from the pilot's eyes.

During the design process, proposed window designs can be evaluated by comparing the polar projection of the proposal against the polar projection of previous designs and against the regulatory requirements, expressed in angle/angle coordinates. Calculating and plotting the polar projection for a window design is not a straight-forward geometric construction due to the following factors. Both left and right eyes of the pilot are used. The final graph is a union of the vision from both eyes. The pilot's head is rotated as the window area is scanned; therefore the origin point for each "sight ray" is continuously changing. The sight rays also are refracted as they pass through the transparency material.

When the requirements for the external visual field for a new window design are expressed as an angle-angle plot, an initial design point can be found by "reverse projection," that is, to project the limits defined on the angle-angle plot back onto the three dimensional surface of the aircraft being designed. Due to the complicating factors mentioned above, this is a very difficult task. Previous to this invention there were two methods that could be used to accomplish a reverse projection, both entirely unsatisfactory.

The first method was trial and error: first, take an educated guess as to the shape of window edges that would produce a given polar projection, then create trial window geometry on the aircraft surface, next do a polar projection using all the rules set out above, and finally evaluate the result and iterate the process, adjusting the three dimensional geometry as necessary. This method is very laborious, time consuming and, due to the number of iterations required, inefficient and ineffective for optimizing the window shapes.

The second method was to create 3D surfaces radiating from an eye point to represent the desired angle-angle criteria. This set of surfaces would be intersected with the aircraft surface to create curves defining the edges of windows. Unfortunately, a simple geometric construction cannot account for the moving eye points and light refraction through the transparencies. Therefore this method is inaccurate, and the inaccuracy is more acute for windows that are not planar, yet this is a method previously used at Boeing and elsewhere to create window geometry during initial flight deck design.

SUMMARY

The invention is a computer aided design system that transfers two dimensional curves representing angle-angle view requirements onto three dimensional transparencies such as flight deck window surfaces. The computer aided design system takes into account pilot head movement and the refractive properties of the window in ascertaining the boundaries of the window surfaces. The technique is extremely beneficial compared to the previous techniques due to reduced design time and increased accuracy and quality of results. In an illustrative embodiment, the computer aided design system comprises a software "script" that operates in a CAD program. The results are immediately available, visually intuitive, and easily usable.

BRIEF DESCRIPTION OF THE DRAWINGS

FIGS. 4 and 4a are diagrams illustrating a determination of the outer boundaries of an air craft windshield in accordance with the invention.

DETAILED DESCRIPTION

The invention aids in the design of aircraft flight deck windows by transferring view requirements from 2D angle-angle curves to 3D curves on the window surface.

In one embodiment, the invention may be a software script that interfaces with a host computer aided design (CAD) program. Illustratively, the host CAD program may be the RHINO desktop based graphics program running on a personal computer (PC), available from Robert McNeel & Associates, modified through user defined scripts.

The user first selects an eye reference point, also known as a design eye point. The computer program then computes the location of the pilot's eyes and head pivot point and accesses a data base that contains data representing the inner and outer surfaces of the window, and one or more curves that represent angle-angle view requirements, such as the minimum clear view area specified by FAA regulations. The software then creates curves on the 3D outer window surface, for the left and right eye, the intersection of which, if projected using head rotation and refraction, will recreate the input curves. These computed curves can be called a "reverse polar projection."

The software uses the algorithms that rotate the model pilot's head and send refracted rays through the window surface. To create the reverse polar projection on the fuselage surface, 2D vision polar curves are first sampled to create a set of points on the curves, the number of which can be specified by the user. For each sample point and for one or both of the pilot's eyes, or for the eye reference point, the software takes an educated guess for a head location and sight ray direction that would produce an output ray (refracted by the window) that would match the angular coordinates (altitude and azimuth) of the sample point. An iterative process is used to adjust the head location and sight ray direction until the output ray direction matches the angular coordinates of the sample point within a tolerance that can be specified by the user. The location from which the output ray emerges on the outer fuselage surface is saved as a point on the reverse polar projection. After all points on the reverse polar projection are plotted on the fuselage surface in this manner, the multiple points are splined together to produce the 3D window edge curves.

Figure 1:
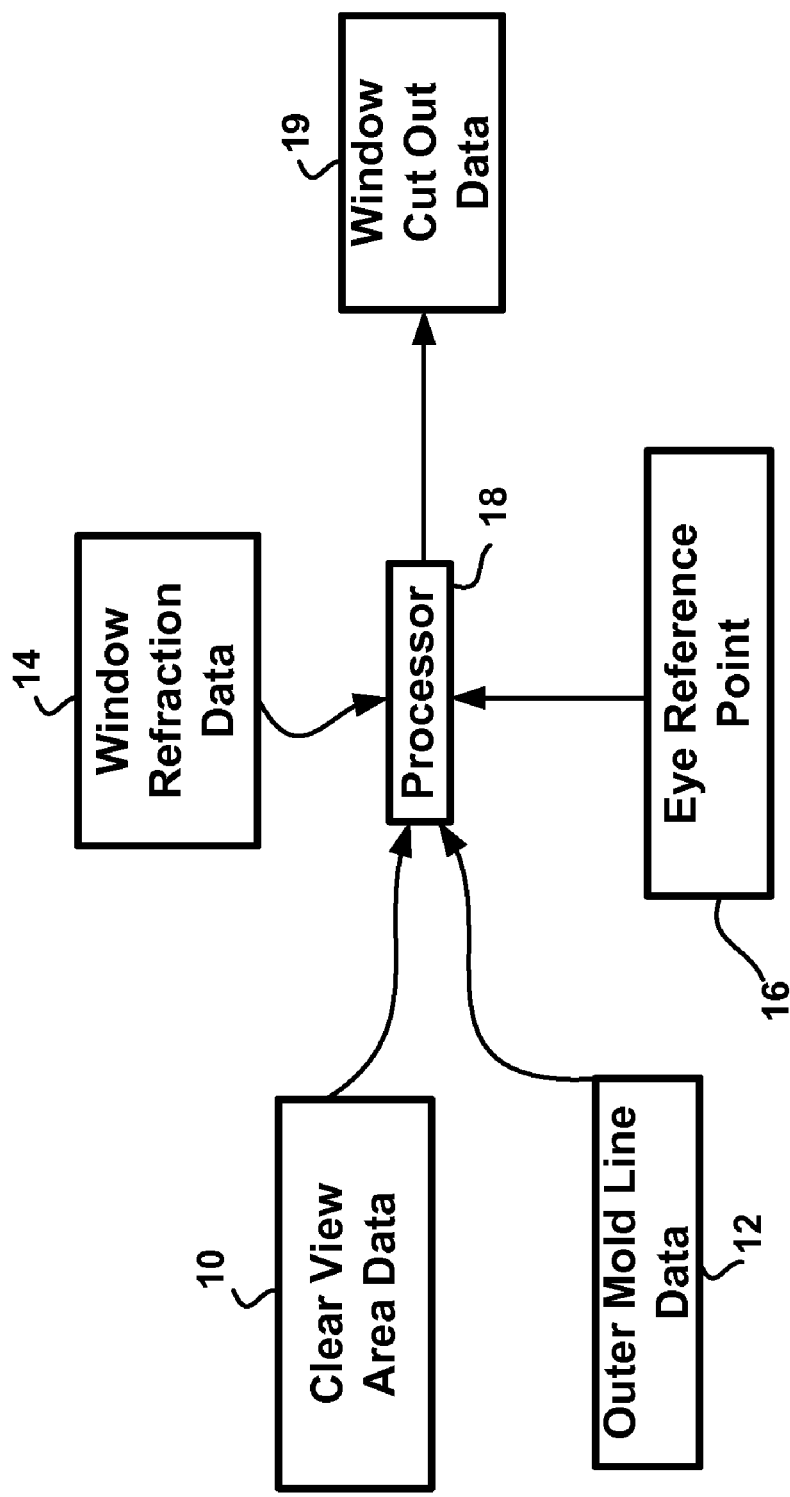
FIG. 1 is a block diagram of a computer aided design system in accordance with the invention that accurately determines the outer boundaries of an aircraft windshield that meets a desired clear view area specification like the one shown in FIG. 2.

FIG. 1 is a block diagram of the main components of a computer aided design (CAD) system in accordance with this invention. The apparatus of FIG. 1 comprises a computer file, data base, or other electronic storage element 10 which contains data representing the clear view area to be provided to the pilot to provide him sufficient vision outside the aircraft to be able to safely perform any maneuvers that can be performed by the aircraft.

Figure 2:
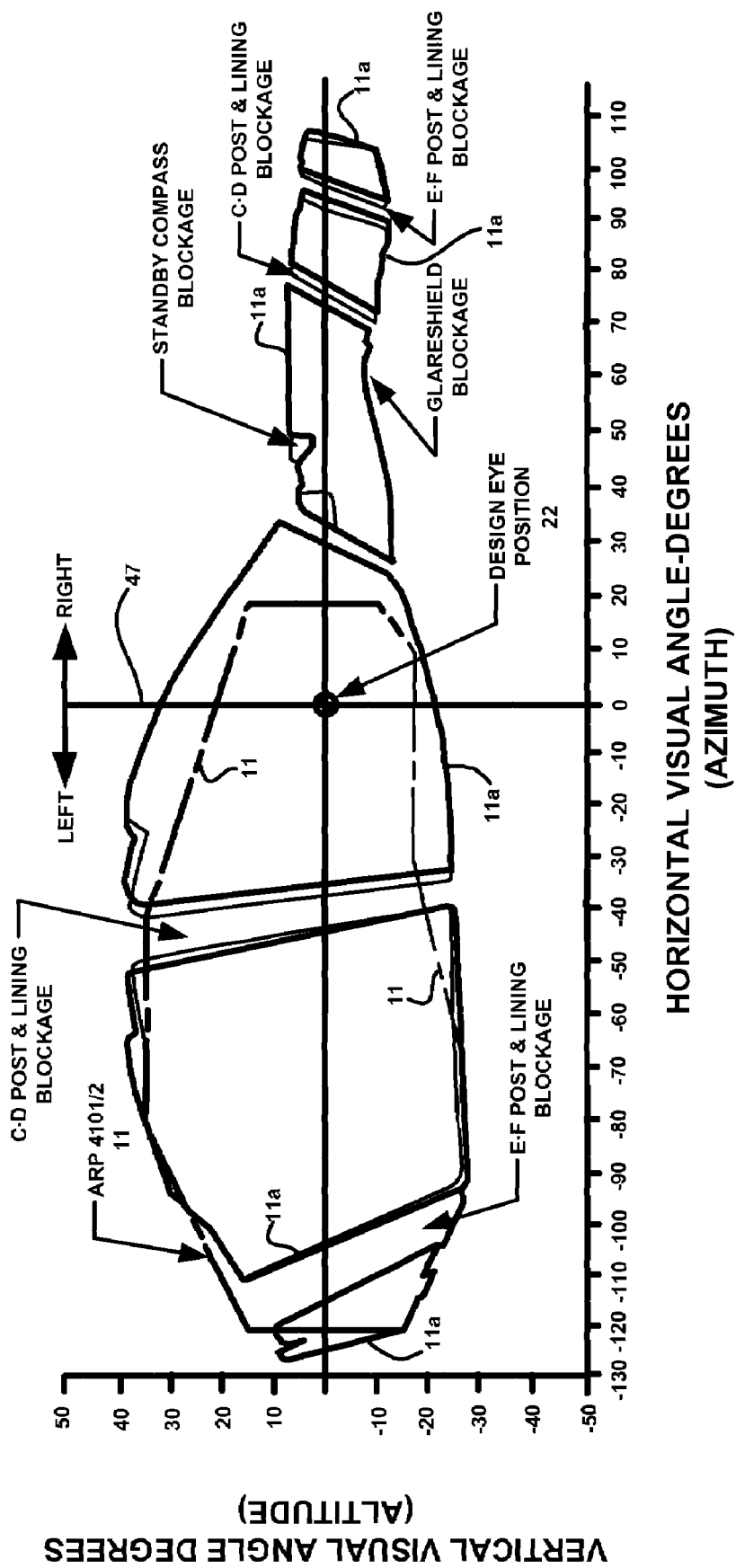
FIG. 2 is a graph depicting data representing a desired clear view area for the pilot of an aircraft.

Clear view area specifications can be found in many sources, such as aviation industry research materials, military specifications, and regulatory material published by the FAA. An example of an FAA specification is shown in FIG. 2. FIG. 2 is a curve 11 that defines the minimum altitude and azimuth angles that the pilot must be able to view looking out the aircraft windshield. For illustrative purposes, FIG. 2 also shows a curve 11a that represents the clear view area of an actual aircraft windshield.

The altitude and azimuth angle are measured with respect to a design eye position 22 which is midway between the eyes of a pilot properly seated at his station in the cockpit and looking straight ahead through the aircraft windshield. The pilot's eyes are assumed to be located a predetermined distance, such as 1.25 inches, left and right on either side of the design eye position. The pilot's head is assumed to rotate about a vertically directed central axis 47 located a predetermined distance behind the design eye position 22, for example, 3 5/16 inches aft of the design eye position 22. These dimensions for the eye positions and axis of head rotation are based on the FAA's review of anthropometric data regarding the human cranium. The invention is not limited to any particular assumptions about the eye location or head rotation axis, however.

The azimuth angle is measured from a vertical datum plane running fore and aft of the aircraft through the design eye point and parallel to the central longitudinal axis. The altitude angle is measured from a horizontal datum plane perpendicular to the vertical plane that also passes through the design eye point. Although this embodiment of the invention is described here in terms of clear view area specifications defined by the FAA, the invention is not limited to any particular form of clear view area specification.

In addition to clear view area data in block 10, the apparatus of FIG. 1 also includes three dimensional data representing the shape and location of the outer mold line of the aircraft stored in a computer file, data base, or other storage element 12. The outer mold line of the aircraft comprises three dimensional data representing the location, shape, and orientation of the airplane's fuselage. The outer surface of the aircraft windshield will conform to the outer mold line where the windshield is located on the aircraft. The outer mold line data in the storage element 12 in the area of the windshield thus defines the outer surface of the windshield. Element 12 may also contain data representing the inner surface of the windows to be designed. Such a surface would be the same shape as the outer mold line 20 offset inwardly from the outer mold line 20 by the thickness of the windshield.

The apparatus of FIG. 1 also comprises a storage element 14 which contains window refraction data such as the thickness of the windshield and the refractive indices of air and the material making up the windshield. Storage element 16 contains the coordinates of an eye reference point 22 defined and entered into the system by a user. The eye reference point entered into the CAD system of FIG. 1 is the same as the design eye point 22 in FIG. 2. A processor 18 computes, from the value of the eye reference point 22 in block 16, a pilot head orientation comprising a plurality of eye positions achieved at a plurality of head rotation angles. The processor 18 computes a set of data points representing the shape and dimensions of the window cutout in the outer mold line of the aircraft that meets the clear view area requirements represented by the data in block 10. This computation is made in light of the outer mold line data from block 12, the refraction data from block 14, and the pilot head orientation derived from the eye reference point 22 stored in block 16. The window cutout data is stored in block 19 and may be displayed on a computer monitor by itself or superimposed on the outer mold line data from block 12.

Figure 3:
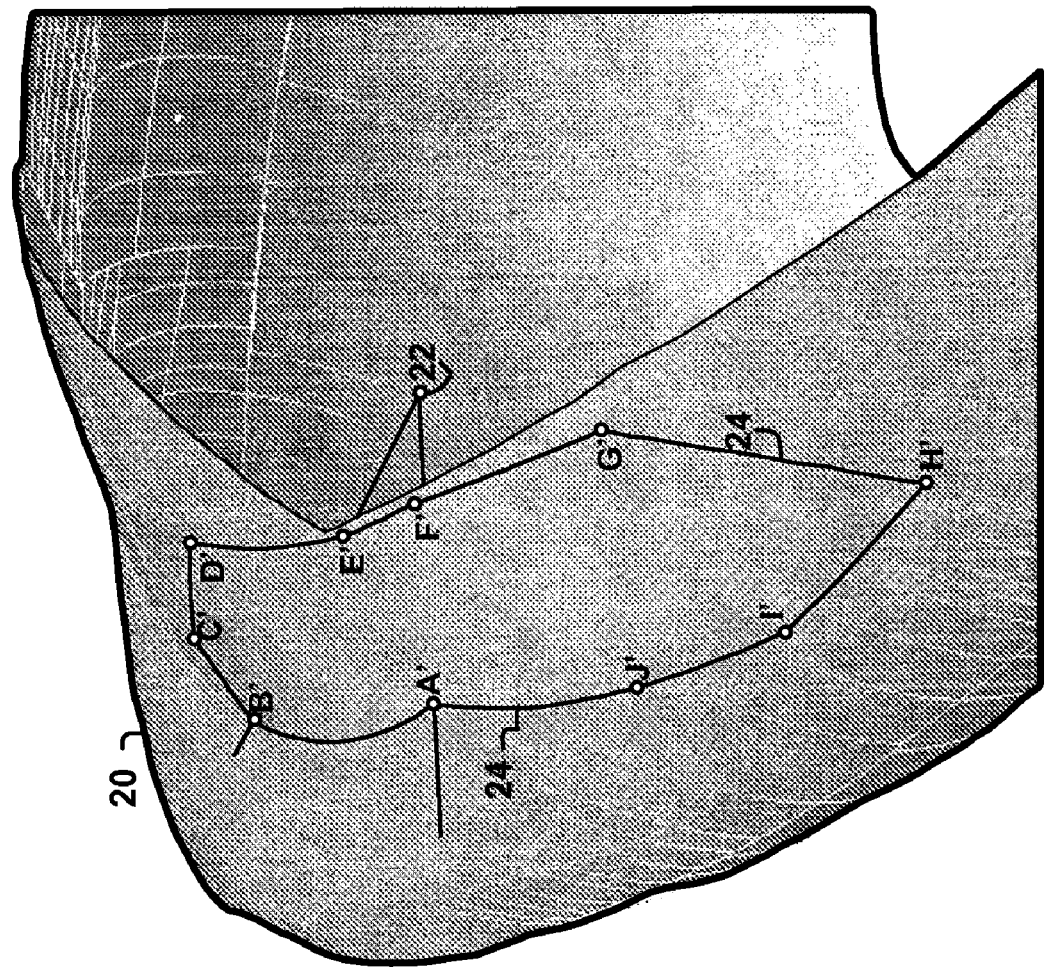
FIG. 3 is a diagram illustrating a prior way of determining the outer boundaries of an aircraft windshield.
Figure 3:
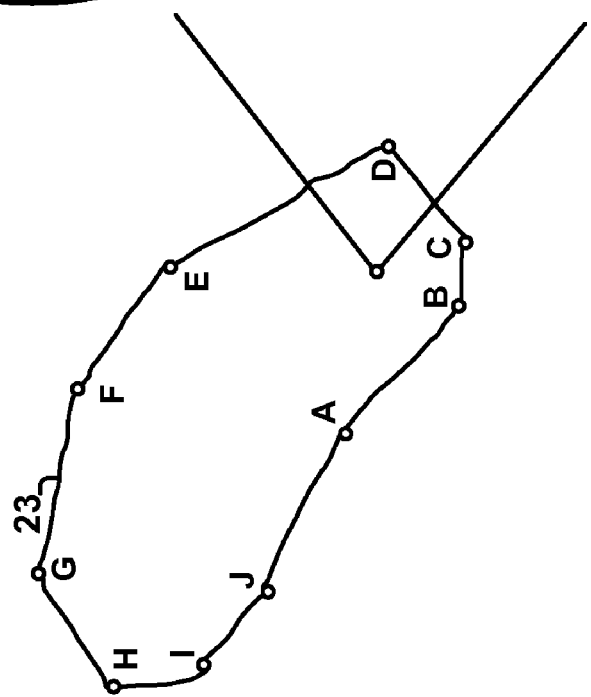

FIG. 3 is a graphical representation of how the windshield cutout was determined in the prior art. FIG. 3 shows a series of surfaces 20 representing the "outer mold line" of the aircraft (so called because the surface appears as the outer most line in a cross-sectional drawing that includes the fuselage skin). FIG. 3 also shows a point representing the design eye position 22 and a clear view area curve 23. The cutout in the outer mold line for the windshield is defined by a closed curve 24 which is generated as follows. A number of points, for example, points A-J, on the clear view curve 23 are selected. Each of the selected points represents an altitude angle and an azimuth angle. For each point A-J, a ray is generated originating with the design eye position 22 and having the altitude and azimuth angles of the respective point A-J on curve 23. The rays for points A-J intercept the outer mold line at respective points A'-J' on curve 24. By intersecting planes defined by the design eye position and each pair of sequential points A'B' through J'A' with the OML surfaces 20, the points A'-J' are connected together to form curve 24, which defines the location, shape, and dimensions of the window cutout. As made plain in the discussion below, this technique is inaccurate and a windshield designed in accordance with this procedure is larger than is necessary to meet the clear view requirements represented by curve 23. This will result in a significant weight penalty for the aircraft.

Figure 4A:
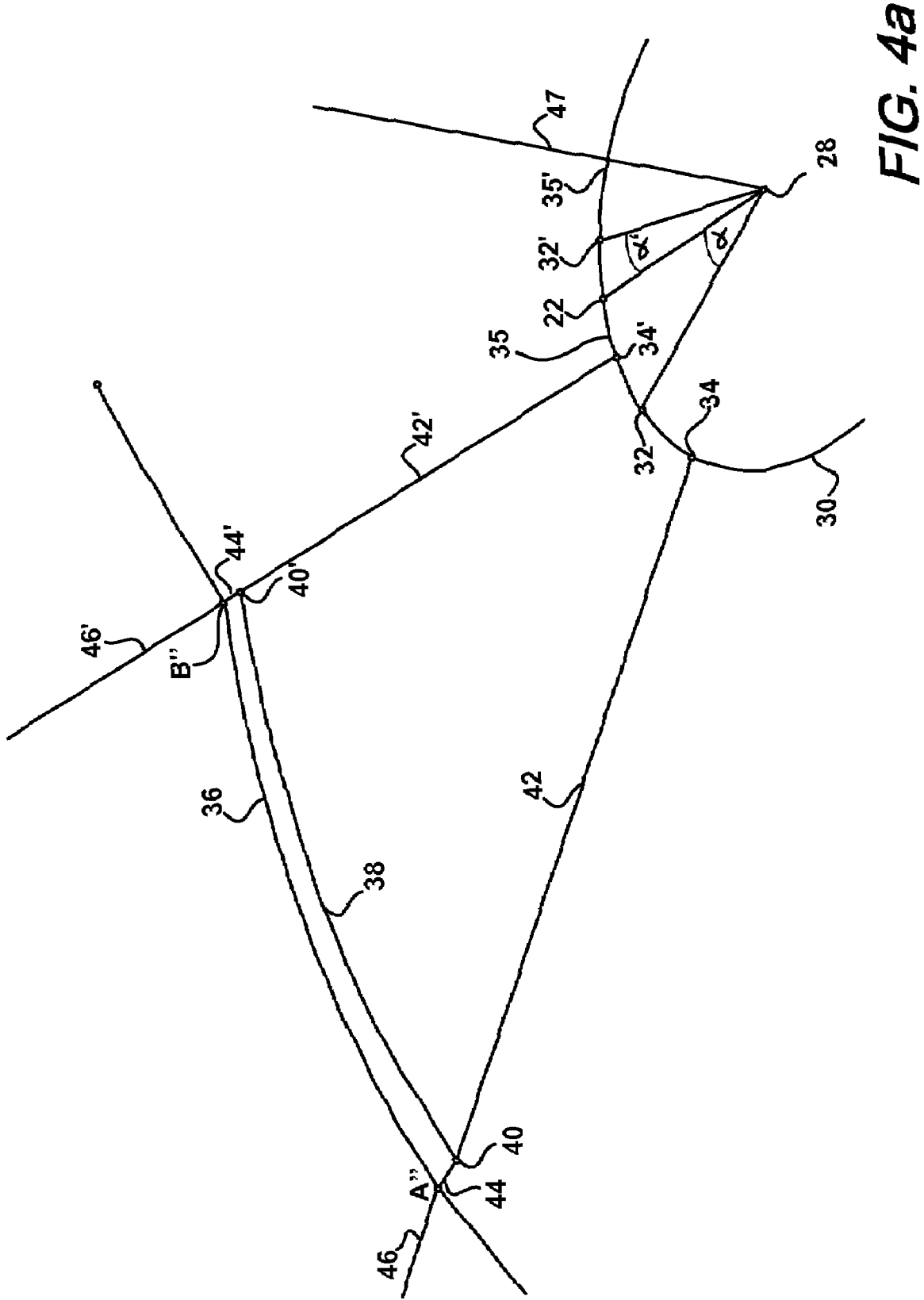

FIGS. 4 and 4a are graphical representations of the operation of the CAD system shown in FIG. 1. The technique implemented by the apparatus of FIG. 1, and shown graphically in FIGS. 4 and 4a, takes into account head rotation, left and right eye positions, and window refraction in computing the boundaries of the windshield. This results in the creation of a smaller, lighter windshield that still meets the clear view area requirements. Both left and right eye plots can be produced by using the apparatus of FIG. 1. Plots based on the eye reference point 22, or any other point, also may be produced. FIGS. 4 and 4*a* depict a left eye plot produced by the apparatus of FIG. 1.

FIG. 4 graphically depicts the eye reference point 22, a head pivot point 28 on the previously mentioned central axis of head rotation 47, and a circle 30 around which the eye reference point 22 rotates as the pilot's head rotates. FIG. 4 also shows a point 32 which is the location of the eye reference point after an angular rotation α of the head to the left. FIG. 4 shows another point 34 which the location of the left eye after head rotation through the angle α. Point 35 is the location of the right eye after head rotation through angle α.

The processor 18 in FIG. 1 computes the left eye curve 36 representing a window cutout meeting the requirements indicated by curve 23. Similarly, the processor 18 may compute a corresponding curve for the right eye. The processor 18 may also compute a curve for the original eye reference point 22, the eye reference point 32 obtained through head rotation, or any other desired point.

The processor 18 also may compute the inside surface of the windshield from the outer mold data in block 12 if the inside surface data is not present in data block 12. Specifically, the inside surface of the windshield is the same shape as the outer mold line 20 offset inwardly from the outer mold line 20 by the thickness of the windshield. Curve 38 in FIG. 4 lies on, and therefore illustrates, the computed location of the inside surface of the windshield.

In this example of the invention, the processor 18 constructs refracted rays originating at the left eye position 34, the right eye position 35, or the eye reference point 32 at a plurality of different angular head positions. The rays extend to the computed inner windshield surface 38, undergo a simulated refraction as they pass through the space between the inner windshield surface 38 and the outer mold line 20, and then undergo an additional simulated refraction as they emerge from the outer mold line 20. The processor 18 engages in an iterative procedure to find the rays beginning at different eye positions that emerge from the outer mold line 20 at altitude and azimuth angles specified by curve 23. In FIGS. 4 and 4*a*, the points on the outer mold line 20 that these rays pass through define a left eye curve 36 representing the window cutout for the airplane.

Similar to the case of FIG. 3, a number of curve segments, such as those lying between the points A-J on curve 23, are selected. Points on these curve segments from the two dimensional curve 23 are projected by the processor 18 onto the three dimensional outer mold line 20. For each point on the selected curve segment such as those lying between points A-J, the processor 18 reads the azimuth and altitude angles from curve 23, sets the head rotation angle to the azimuth angle, and computes one or both of the left eye position 34 and the right eye position 35. If a left eye plot is to be generated as in FIG. 4, the processor 18 then constructs a refracted sight ray that extends from the left eye position 34 through the simulated windshield. The sight ray is composed of a first incident line segment having an azimuth and altitude approximately that of a point on curve 23. One end point of that first line segment is the computed left eye position 34 and the other end point is the point where the first line segment intersects the computed inside surface 38 of the window. Using the laws of refraction, a second line segment is constructed representing the simulated path of the sight ray through the simulated windshield from the point of intersection between the first line segment and the inside surface 38 of the windshield to the point where the ray exits the mold line. The processor 18 then constructs an exit portion of the refracted sight ray emerging from the outer mold line 20, using the laws of refraction, and computes the azimuth and altitude of the exit portion of the refracted ray. The computed azimuth and altitude angles are compared to the azimuth and altitude angles for the point on curve 23 being projected. If they are the same or within some desired tolerance, the point where the ray intercepts the outer mold line 20 is recorded as one of the points on curve 36 (points A"-J", for example). If they are not, the head rotation angle, altitude angle, and/or azimuth angle of the incident line segment of the refracted ray at the left eye point 34 is adjusted a small amount and the ray recomputed. This process is continued iteratively until the exit portion of the refracted ray has the correct azimuth and altitude angles, at which time the point where the refracted ray intercepts the outer mold line 20 is recorded as a window edge point such as A"-J" on the outer mold line 20. This process of finding points such as A"-J" on the outer mold line 20 is repeated for all points on all selected curve segments on curve 23. The points such as A"-J" may then be connected together to form a smooth left eye curve 36 which defines the location, shape, and, and size of the window cutout in the outer mold line 20 of the airplane. A right eye curve or an eye reference point curve may be computed in the same manner using the right eye point 35 or the rotated eye reference point 32 as the starting point for the sight ray constructed by the processor 18.

A detailed description of the construction of one of the projected curve segments will now be described with reference to FIG. 4*a*, a close up view of the construction from behind and above the design eye position 22. Construction of any other projected curve segments is similar. Consider, for example, the projected curve segment that identifies the projection of the curve between points A and B on 2D curve 23 as the curve between points A" and B" on 3D curve 36. To begin the construction, the user selects the 2D curve segment and enters the number of points along that curve for the processor 18 to sample. The first such point will be point A. The processor 18 then reads the azimuth and altitude angles that point A represents. The processor 18 then rotates the simulated pilot's head about a vertical axis 47 by an angle α equal to the azimuth angle of point A and computes the left eye position 34. The processor 18 then constructs an incident line segment 42 extending from left eye position 34, parallel to the plane formed by the design eye point 22 and the vertical axis 47, and at a vertical angle equal to the altitude angle of point A, to a point 40 where the line segment intercepts the computed inner window surface 38. The processor 18 next constructs an interior line segment 44 which extends from point 40 through the simulated windshield in a direction dictated by the laws of refraction. The direction of segment 44 is a function of the angle of incidence of segment 42 on the inside surface of the windshield, the refractive index of air, and the refractive index of the windshield material. The ray constructed by the processor 18 also undergoes refraction when it emerges from the outer mold line 20. The processor 18 constructs an exit portion 46 of the refracted ray from the exit point on the outer mold line 20 in a direction dictated by the laws of refraction. The processor 18 notes the azimuth and altitude angles of exit portion 46 and compares these angles with the azimuth and altitude angles of point A. If the values of the azimuth and altitude angles of the exit portion 46 are equal to the azimuth and altitude of point A, or within a user selected tolerance of those angles, the coordinates of the point where exit portion 46 begins on the outer mold line 20 is recorded as one of the points on the curve 36, point A" in FIGS. 4 and 4*a*. If the measured azimuth and altitude angles are outside the user selected tolerance, the processor 18 iteratively adjusts the head angle and the angle of the segment 42 until an exit portion 46 having desired azimuth and altitude angles is obtained and point A" is identified and saved. This process is repeated to find projected exit points for the rest of the user selected points on the curve segment between points A and B, until finally point B" is obtained using rotation α', points 34' and 40', lines 42', 44', 46' and any required iteration. The projected line segment on the outer mold line 20 between points A" and B" is then constructed as a smooth curve passing through all of the calculated exit points. This process can be repeated for each of the curve segments between points B-J on curve 23 to obtain the curve segments on the outer mold line 20 between points B"-J" represented by curve 36.

Figure 5:
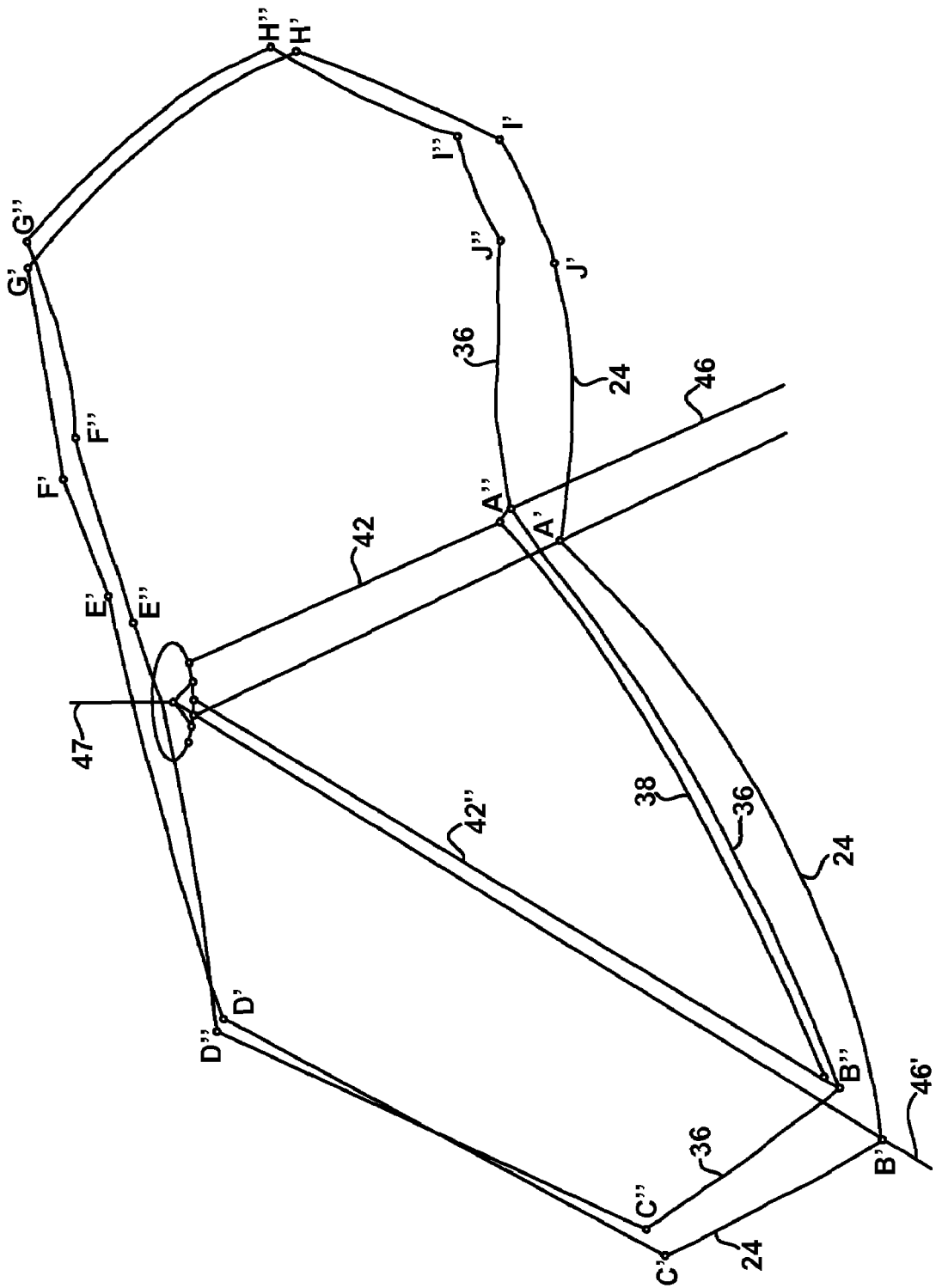
FIG. 5 is a diagram comparing the results of using the techniques shown in FIGS. 3 and 4.

As noted above, this invention creates a more accurate projection of the clear view area data onto the outer mold line 20 of the aircraft. Aircraft windshields, designed using the technique of this invention, are no larger than necessary to achieve the required view outside the aircraft. Since the glass or other transparent material used to make windshields is relatively heavy, it is important to minimize the amount this type of material that is used to construct an airplane. Windshields designed in accordance with the invention meet the relevant clear view area specifications, but use less material than windshields designed using prior techniques. This results in a significant weight saving for the airplane. FIG. 5 illustrates the point. FIG. 5 superimposes curve 24 from FIG. 3 and curve 36 from FIG. 4. As shown in FIG. 5, prior art curve 24 defines a significantly larger windshield than that defined by curve 36 generated by the invention of this application.

The curve 36 in FIGS. 4, 4a, and 5 are left eye plots. As indicated above, a right eye plot can also be obtained. Eye reference point plots are also possible. Because of the displacements between the left eye, the right eye, and the eye reference point, vision polar curves for the left eye, the right eye, and the eye reference point will differ slightly.

The Title, Technical Field, Background, Summary, Brief Description of the Drawings, Detailed Description, and Abstract are meant to illustrate the preferred embodiments of the invention and are not in any way intended to limit the scope of the invention. The scope of the invention is solely defined and limited in the claims set forth below. For example, the invention is not limited to applications involving the design of aircraft windows. It is applicable to any situation involving the design of the shape and configuration of a transparency that has to meet a clear view area specification. and the like.

The invention claimed is:

1. A computer aided design system for determining the outer boundaries of a transparency that meets a desired clear view area specification, comprising:
    a source of data representing a desired clear view area;
    a source of data representing head orientation; and
    a processor that generates data representing the outer boundaries of the transparency in response to the data representing the desired clear view area and the data representing head orientation
    wherein the data representing head orientation comprises the location of an eye reference point and the processor computes left and right eye positions with respect to the eye reference point.

2. The computer aided design system of claim 1, in which the data representing the desired clear view area is a two dimensional angle-angle vision graph representing left and right viewing angles and up and down viewing angles.

3. The computer aided design system of claim 1, in which the processor computes the location of an axis of head rotation with respect to the eye reference point.

4. The computer aided design system of claim 3, in which the processor computes left and right eye positions in light of angular head position.

5. A computer aided design system for determining the outer boundaries of a transparency that meets a desired clear view area specification, comprising:
    a source of data representing a desired clear view area;
    a source of data representing one or more refractive properties of the transparency; and
    a processor that generates data representing the outer boundaries of the transparency in response to the data representing the desired clear view area and the data representing one or more refractive properties of the transparency and processor computed left and right eye positions with respect to an eye reference point.

6. The computer aided design system of claim 5, in which the data representing the desired clear view area is a two dimensional angle-angle vision graph representing left and right viewing angles and up and down viewing angles.

7. The computer aided design system of claim 5, in which the refractive properties of the transparency comprises the index of refraction and thickness of the transparency.

8. The computer aided design system of claim 5, further comprising:
    a source of data representing head orientation;
    the processor generating data representing the outer boundaries of the transparency further in response to the data representing head orientation.

9. A computer aided design system for determining the shape and dimensions of a window cutout in the outer mold line of an aircraft, comprising:
    a processor that generates output data representing the shape and dimensions of the window cutout in response to data representing a desired clear view area for the window, data representing the outer mold line, data representing head orientation, and data representing the refractive properties of the window
    wherein the data representing head orientation comprises the location of an eye reference point and the processor computes left and right eye positions with respect to the eye reference point.

10. A method of designing a windshield of an aircraft using a computer aided design system, comprising the steps of:
    inputting data representing a desired clear view area;
    inputting data representing an eye reference point;
    generating data representing pilot eye position and pilot head rotation in response to the data representing the eye reference point;
    inputting data representing refractive properties of the windshield;
    inputting data relating to the shape and location of an inner and/or outer surface of the windshield; and
    generating data representing the outer edge of the windshield in response to the data representing the desired clear view area, the pilot eye position and head rotation, the refractive properties of the windshield, and the shape and location of an inner and/or outer surface of the windshield
    wherein the processor computes left and right eye positions with respect to the pilot eye position.

* * * * *